(12) United States Patent
Okuno et al.

(10) Patent No.: US 7,585,767 B2
(45) Date of Patent: Sep. 8, 2009

(54) SEMICONDUCTOR DEVICE AND METHOD FOR FABRICATING THE SAME

(75) Inventors: Yasutoshi Okuno, Kyoto (JP); Michikazu Matsumoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 383 days.

(21) Appl. No.: 11/356,959

(22) Filed: Feb. 21, 2006

(65) Prior Publication Data
US 2006/0189087 A1 Aug. 24, 2006

(30) Foreign Application Priority Data

Feb. 21, 2005 (JP) .............................. 2005-043721
Nov. 25, 2005 (JP) .............................. 2005-339742

(51) Int. Cl.
*H01L 21/44* (2006.01)
(52) U.S. Cl. .................... 438/655; 438/581; 438/583
(58) Field of Classification Search ............... 438/542, 438/195, 655, 656
See application file for complete search history.

(56) References Cited

U.S. PATENT DOCUMENTS

| 5,698,869 | A | * | 12/1997 | Yoshimi et al. | 257/192 |
| 5,756,391 | A | * | 5/1998 | Tsuchiaki | 438/592 |
| 5,776,822 | A | * | 7/1998 | Fujii et al. | 438/586 |
| 5,869,397 | A | * | 2/1999 | Miyakawa | 438/655 |
| 5,924,010 | A | * | 7/1999 | Chen et al. | 438/653 |
| 6,025,267 | A | * | 2/2000 | Pey et al. | 438/656 |
| 6,303,504 | B1 | * | 10/2001 | Lin | 438/683 |
| 6,689,688 | B2 | | 2/2004 | Besser et al. | |
| 2006/0113605 | A1 | * | 6/2006 | Currie | 257/368 |

FOREIGN PATENT DOCUMENTS

JP 5-315286 11/1993
WO WO 2004/040622 A2 5/2004

OTHER PUBLICATIONS

M. Kim et al., "High Thermal Stability of Ni Monosilicide from Ni-Ta Alloy Films on Si(100)", Electrochemical and Solid-State Letters, 2003, 6(10) pp. G122-G125.
R. Xiang et al., "Formation of Ni Silicide by Addition of Hf", Preliminary Material for 65th Annual Meeting of Japanese Society of Applied Physics, Sep. 1 to 4, Autumn in 2004 (Lecture No. 2P-M-10) pp. 708.
Y. Ok, et al., "Effect of a Mo Interlayer on the Electrical and Structural Properties of Nickel Silicides", J. of the Electrochemical Society, 2003, 150(7) pp. G385-G388.

(Continued)

*Primary Examiner*—Thanh V Pham
*Assistant Examiner*—Caleb Henry
(74) *Attorney, Agent, or Firm*—McDermott Will & Emery LLP

(57) ABSTRACT

A gate electrode is formed on a silicon substrate, and then source/drain regions are formed at both sides of the gate electrode in the silicon substrate. Thereafter, an alloyed silicide layer is formed on the source/drain regions. The step of forming the alloyed silicide layer includes the step of depositing a first metal film, a nickel film and a second metal film in this order to form a multilayer metal film and the step of performing heat treatment after the formation of the multilayer metal film.

11 Claims, 3 Drawing Sheets

OTHER PUBLICATIONS

J. Maa, et al., "Effect of interlayer on thermal stability of nickel silicide", J. Vacuum Science Technology, 2001, 19(4), pp. 1595-1599.

D. Mangelinck et al., "Enhancement of thermal stability of NiSi films on (100)Si and (111)Si by Pt addition," Applied Physics Letters, 1999, 75(12), pp. 1736-1738.

E. Horache, et al., "Nb/Ni and Ni/Nb bilayers on Si: Rapid thermal processing, phase separation, and ternary phase formation," J. of Applied Physics, 1991, 69(10), pp. 7029-7033.

R. Wang, et al., "Comparison of the thermal stabilities of NiSi films in Ni/Si, Ni/Pd/Si and Ni/Pt/Si systems," J. of Physics of Condensed Matter, 2003, 15, pp. 1935-1942.

* cited by examiner

SEMICONDUCTOR DEVICE AND METHOD FOR FABRICATING THE SAME

BACKGROUND OF THE INVENTION (1) Field of the Invention

The present invention relates to semiconductor devices and methods for fabricating the same, and particularly relates to a structure of a silicide layer and a method for forming the silicide layer.

(2) Description of the Related Art

In general metal oxide semiconductor (MOS) transistors, reduction of parasitic resistance such as contact resistance and wiring resistance is important in increasing operation speed. The reduction of parasitic resistance in such transistors is generally achieved by siliciding upper portions of source/drain regions and upper portions of gate electrodes.

To increase the integration degree of a large-scale semiconductor integrated (LSI) circuit device, reduction of the vertical size as well as the horizontal size is needed. As a technique for reducing the vertical size, the junction depth of a doped layer to be source/drain regions needs to be reduced. However, if the thickness of the doped layer in the semiconductor substrate is small, there arises a problem in which the resistance of the doped layer increases so that the operation speed of the semiconductor device decreases.

To prevent this decrease, it is effective to reduce the source/drain resistance by using a structure in which a metal silicide layer is formed in the surface of the doped layer. As a method for forming the metal silicide layer, a method in which a metal film is deposited over a silicon substrate and a polysilicon film to be a gate electrode, and is then subjected to heat treatment such that silicon and metal react with each other to form silicide in upper portions of source/drain regions and an upper portion of the gate electrode has been conventionally used.

As a material for a silicide layer, a material capable of reducing the amount of silicon consumed during silicidation for a shallow junction is needed. In view of this, a silicide formation technique using, as a material capable of reducing the amount of consumed silicon, nickel (Ni) that forms low-resistance monosilicide has been developed.

However, it is known that $NiSi_2$, which is a disilicide phase of Ni silicide, has a lattice constant fairly close to that of silicon and forms an inverted-pyramidal interface by subsequent high-temperature heat treatment or under inappropriate process conditions. As a method for forming Ni silicide with stability by enhancing resistance (heat resistance) to subsequent high-temperature heat treatment, a method for alloying a silicide has been proposed (see, for example, patent literature 1: U.S. Pat. No. 6,689,688).

In this patent, examples of elements having the effect of stabilizing NiSi, which is a low-resistance monosilicide phase, include Ge, Ti, Re, Ta, N, V, Ir, Cr and Zr (see, for example, non-patent literature 1: Min-Joo Kim et al., "High Thermal Stability of Ni Monosilicide from Ni—Ta Alloy Films on Si(100)", Electrochem. Solid-State Lett. 6, 2003, G122-G125).

In addition, it is suggested in a report that Hf, which is an element exhibiting physical/chemical properties similar to those of Zr, also has a similar effect (see, for example, non-patent literature 2: R. Xiang (in Tokyo institute of Technology) et al., "Formation of Ni Silicide by Addition of Hf", Preliminary Material for 65th Annual Meeting of Japanese Society of Applied Physics, P. 708, September 1 to 4, Autumn in 2004 (Lecture No. 2P-M-10)). It is also suggested in other reports that elements such as Mo, Ir, Co and Pt have similar effects (see, for example, non-patent literature 3: Young-Woo Ok, et al., "Effect of a Mo Interlayer on the Electrical and Structural Properties of Nickel Silicides", J. Electrochem. Soc. 150, 2003, G385-G388, non-patent literature 4: Jer-shen Maa, et al., "Effect of interlayer on thermal stability of nickel silicide", J. Vac. Sci. Technol. A 19, 2001, pp. 1595-1599, and non-patent literature 5: D. Mangelinck et al., "Enhancement of thermal stability of NiSi films on (100)Si and (111)Si by Pt addition", Appl. Phys. Lett., 1999, vol. 75, num. 12, pp. 1736-1738).

SUMMARY OF THE INVENTION

As the technique for alloying silicide, a sputtering process using a Ni alloy target containing a desired alloyed metal is generally employed. The alloy composition of the target needs to be optimized according to the heat-treatment temperature in a process for fabricating a semiconductor device during which the target is to be applied, e.g., a wiring process after silicidation, or according to the junction depth, for example, in the semiconductor device. However, in a mixed semiconductor production line in which multiple types of semiconductor devices are manufactured, to implement a method using a Ni alloy target, sputtering targets need to be respectively provided for all the types of alloyed silicides to be formed and these targets need to be replaced with each other. That is, it is difficult to obtain, by an easy method, an alloyed silicide composition for achieving the best advantages for each device to be fabricated.

It is therefore an object of the present invention to easily form Ni alloy silicide having a desired composition suitable for a semiconductor device to be fabricated.

To achieve the object, the present inventors have conducted various studies. Specifically, as a method for easily forming Ni alloy silicide having a desired composition, a method (first method) for forming an alloyed silicide by ion implantation is proposed in patent literature 1. For example, a method (second method) for forming an alloyed silicide from a metal bilayer film is proposed in each of non-patent literatures 6 and 7 (non-patent literature 6: E. Horache et al. "Nb/Ni and Ni/Nb bilayers on Si: Rapid thermal processing, phase separation, and ternary phase formation", J. Appl. Phys. 69, 1991, pp. 7029-7033 and non-patent literature 7: R. N. Wang et al. "Comparison of the thermal stabilities of NiSi films in Ni/Si, Ni/Pd/Si and Ni/Pt/Si systems", J. Phys.: Condens. Matter 15, 2003, pp. 1935-1942).

However, the first method has production problems such as susceptibility to particle generation due to implantation of a heavy metal at high concentration. According to the second method, the thicknesses of a Ni film and another metal film made of a metal (hereinafter, referred to as an additional metal) other than Ni are controlled, thereby easily obtaining a desired alloyed silicide composition in effect. However, if a metal which easily causes phase separation is used as an additional metal forming Ni alloy silicide, this additional metal is precipitated on the silicide surface during heat treatment for silicidation, so that the effect of enhancing the heat resistance of Ni silicide is limited. Specifically, when the additional metal is precipitated on the silicide surface during heat treatment for silicidation, a multilayer structure "precipitated metal/NiSi/Si substrate" is formed at an initial stage of silicidation. If attention is directed to a portion "NiSi/Si substrate", a "NiSi/Si substrate" interface structure which is also formed in the case of using no alloyed silicide is formed, and therefore improvement of the heat resistance as compared to conventional Ni silicide is not expected. In Ni—Hf alloy silicide formed by the second method, as shown in non-patent literature 2, no significant enhancement of heat resistance is achieved as compared to the heat resistance of Ni silicide which is not alloyed.

Based on the foregoing findings, the present inventors have made a further study on a method for obtaining the effect of enhancing the heat resistance of Ni silicide by alloying, while obtaining a desired Ni alloy silicide composition based on the second method having relatively minor production problems. As a result of the study, the following invention has been conceived.

A method for fabricating a semiconductor device according to the present invention includes the steps of: forming a gate electrode on a silicon substrate; forming source/drain regions at both sides of the gate electrode in the silicon substrate; and forming an alloyed silicide layer on the source/drain regions. The step of forming the alloyed silicide layer includes the step of depositing a first metal film, a nickel film and a second metal film in this order to form a multilayer metal film and the step of performing heat treatment after the formation of the multilayer metal film.

In the method, the first and second metal films may be made of an identical metal.

In the method, each of the first and second metal films may be made of a metal which easily causes phase separation during the formation of the alloyed silicide layer. The metal which easily causes phase separation herein is defined as a metal having a solubility limit with respect to Ni lower than the solubility limit (10 at %) of Si in a silicide reaction temperature range (i.e., about 300° C. to about 600° C.). According to this definition, examples of the metal which easily causes phase separation include Pu, Ru, S, Sb, Se, Sn, Ta, Te, Th, Ti, Zr, Nb, Fe and Ge.

In the method, each of the first and second metal films may be mainly made of a metal selected from the group consisting of Hf, Zr, Nb, Ta, Ti and V.

In the method, the step of forming the alloyed silicide layer may include the step of forming an anti-oxidation film on the multilayer metal film.

A semiconductor device according to the present invention includes: a gate electrode formed on a silicon substrate; source/drain regions formed at both sides of the gate electrode in the silicon substrate; and an alloyed silicide layer formed on the source/drain regions. The alloyed silicide layer is made of alloyed Ni silicide formed by reaction between the silicon substrate and a multilayer metal film formed by depositing a first metal film, a nickel film and a second metal film in this order.

In the semiconductor device, the first and second metal films may be made of an identical metal.

In the semiconductor device, each of the first and second metal films may be made of a metal which easily causes phase separation during the formation of the alloyed silicide layer.

In the semiconductor device, each of the first and second metal films may be mainly made of a metal selected from the group consisting of Hf, Zr, Nb, Ta, Ti and V.

According to the present invention, the film structure of a multilayer metal film and the temperature and time of heat treatment are controlled so that an alloyed silicide layer (Ni alloy silicide layer) having a desired composition is formed. Accordingly, an alloyed silicide layer having a desired composition is easily formed without using a sputtering target associated with each alloyed silicide to be formed.

In addition, according to the present invention, even in a case where a metal which easily causes phase separation is used as an additional metal forming Ni alloy silicide (i.e., in a case where it is difficult to form a Ni alloy silicide by a conventional technique (the second method)), the structure in which a Ni film is vertically sandwiched between other metal films ensures improvement of heat resistance of the Ni alloy silicide layer. Specifically, the structure in which a film made of a metal other than Ni is formed on a Ni film suppresses diffusion of a metal under the Ni film to and across an upper portion of the multilayer film through the Ni film, so that a Ni alloy silicide layer is formed with occurrence of phase separation prevented. This ensures improvement of heat resistance of the Ni alloy silicide layer. As a result, a semiconductor device capable of being miniaturized and operating at high speed is implemented with less production failures.

As described above, the present invention relates to semiconductor devices and methods for fabricating the devices. The present invention is particularly useful in application to, for example, a semiconductor integrated circuit device including a silicide layer because an alloyed silicide layer having a desired composition is easily formed and a semiconductor device capable of being miniaturized and operating at high speed is implemented with less production failures.

DETAILED DESCRIPTION OF THE INVENTION

Hereinafter, a semiconductor device according to an embodiment of the present invention, specifically a semiconductor device including a MOS transistor, and a method for fabricating the device will be described with reference to the drawings.

FIGS. 1A through 1C and FIGS. 2A through 2C are cross-sectional views showing process steps of a method for fabricating a semiconductor device of this embodiment.

Figure 1A:
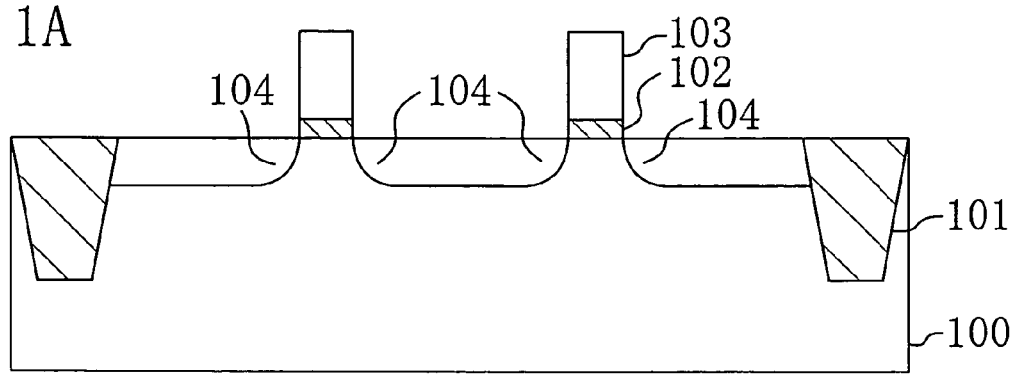
FIGS. 1A through 1C are cross-sectional views showing process steps of a method for fabricating a semiconductor device according to an embodiment of the present invention.

First, as shown in FIG. 1A, a shallow trench isolation 101 is formed in an upper portion of a silicon substrate 100 so as to define transistor regions. Thereafter, a gate insulating film 102 made of, for example, a silicon oxide film and having a thickness of about 2 nm is formed on the transistor regions, and then a polysilicon film having a thickness of, for example, about 140 nm is formed over the entire surface of the silicon substrate 100. Subsequently, the polysilicon film is selectively etched, thereby forming gate electrodes 103. Then, ion implantation is performed with the gate electrodes 103, for example, used as a mask so that a lightly-doped layer (low-concentration impurity diffusion layer) 104 is formed at both sides of the gate electrodes 103 in the silicon substrate 100 in a self aligned manner.

Figure 1B:
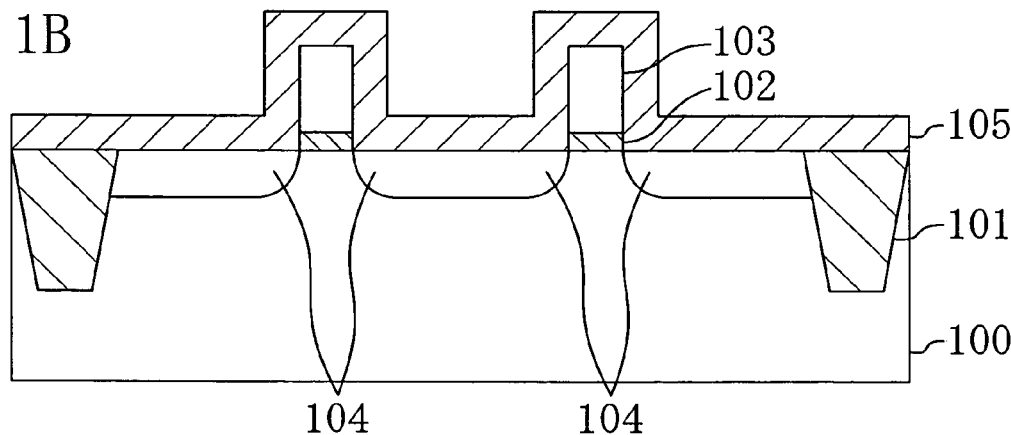

Next, as shown in FIG. 1B, a silicon oxide film 105 is deposited to a thickness of, for example, about 50 nm over the entire surface of the silicon substrate 100 by low pressure (LP)-chemical vapor deposition (CVD) under conditions of, for example, a susceptor temperature of 400° C.

Figure 1C:
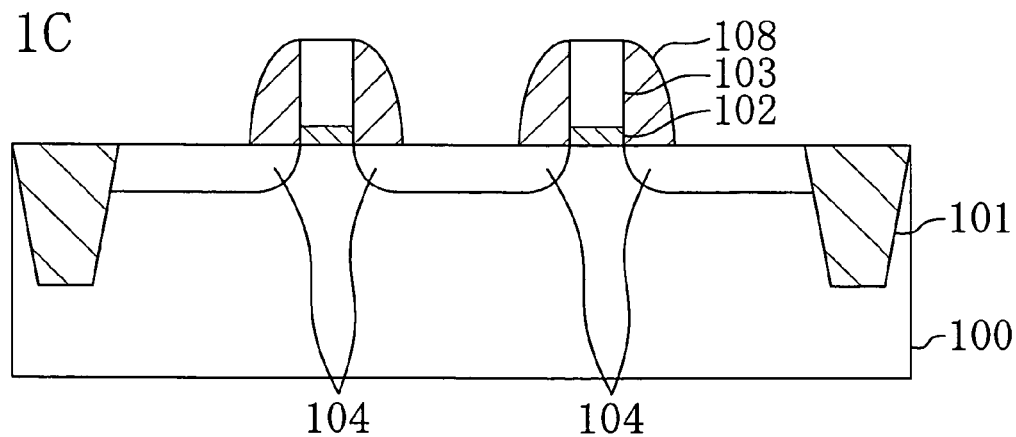

Then, as shown in FIG. 1C, the entire surface of the silicon oxide film 105 is etched back by dry etching under conditions of, for example, a $CHF_3$ flow rate of 120 $cm^3$/min (standard condition), an $O_2$ flow rate of 5 $cm^3$/min (standard condition), a pressure of 8 Pa, and a power of 110 W, thereby forming sidewall spacers 108 on the side faces of the gate electrodes 103.

Figure 2A:
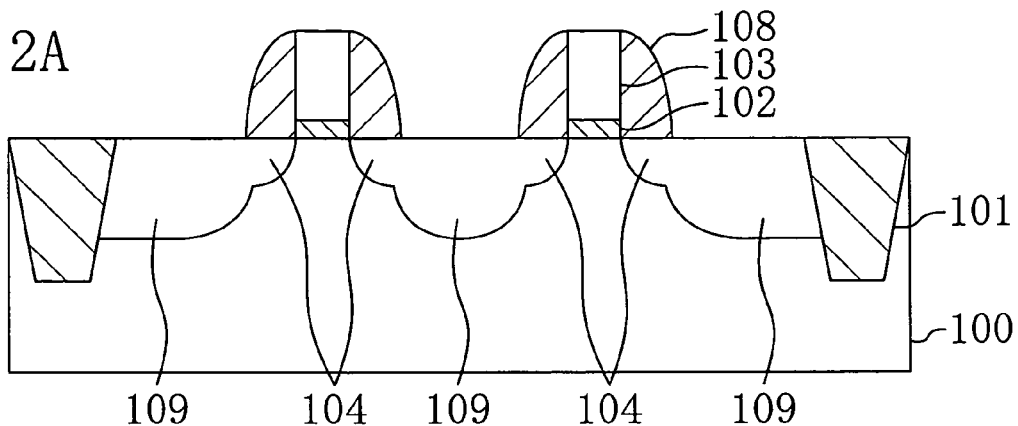
FIGS. 2A through 2C are cross-sectional views showing process steps of a method for fabricating a semiconductor device of the embodiment.

Thereafter, as shown in FIG. 2A, ion implantation is performed with the gate electrodes 103 and the sidewall spacers 108, for example, used as a mask, thereby forming a heavily-doped layer (high-concentration impurity diffusion layer) 109 to be source/drain regions at both sides of the sidewall spacers 108 in the silicon substrate 100 in a self alignment manner.

Figure 2B:
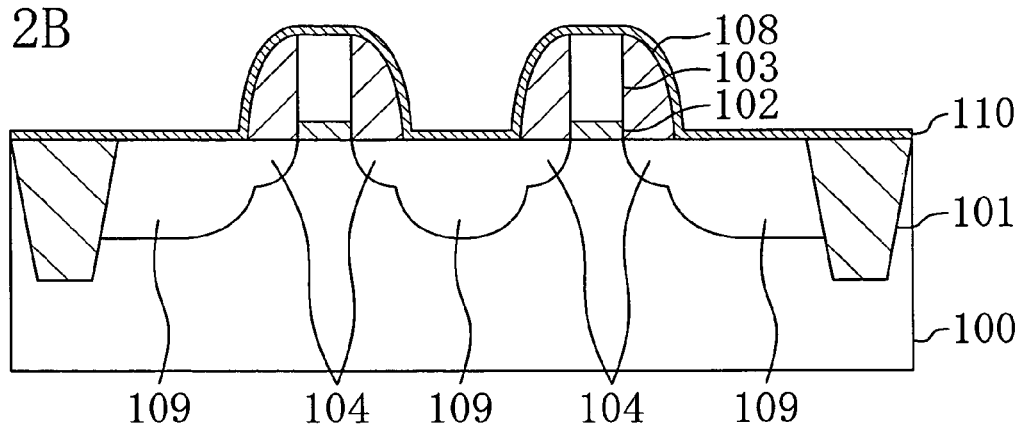

Subsequently, as shown in FIG. 2B, a Hf/Ni/Hf multilayer film 110 is deposited over the entire surface of the silicon substrate 100. Specifically, pretreatment for sputtering is performed, and then Ar sputtering using a hafnium (Hf) target is performed under conditions of, for example, a pressure of 2 mTorr (266 mPa) and a DC power of 100 W, thereby depositing a first Hf film to a thickness of, for example, about 2 nm over the entire surface of the silicon substrate 100. Thereafter, Ar sputtering using a Ni target is performed under conditions of, for example, a pressure of 2 mTorr (266 mPa) and a DC power of 100 W, thereby depositing a Ni film to a thickness of, for example, about 10 nm over the first Hf film. Lastly, Ar sputtering using a Hf target is performed under conditions of, for example, a pressure of 2 mTorr (266 mPa) and a DC power of 100 W, thereby depositing a second Hf film to a thickness of, for example, about 2 nm over the Ni film. In this manner, deposition of the Hf/Ni/Hf multilayer film 110 is completed.

Figure 2C:
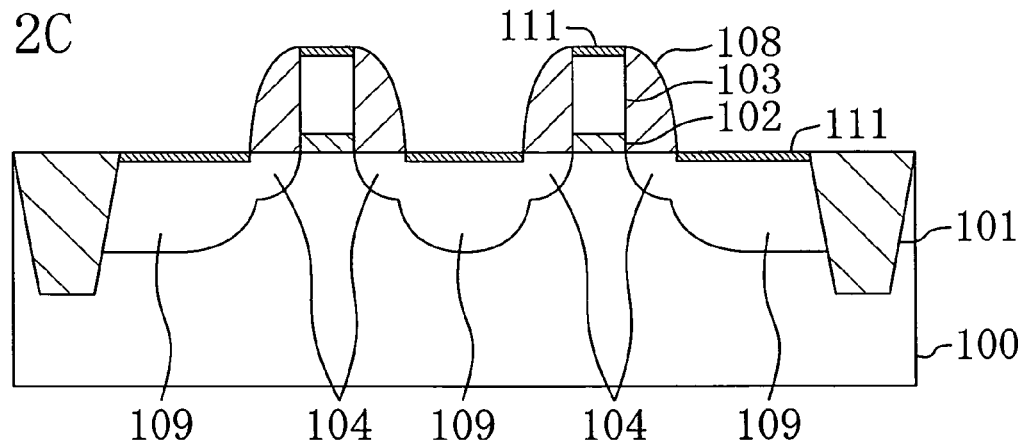

Then, as shown in FIG. 2C, after the deposition of the Hf/Ni/Hf multilayer film 110, a rapid thermal annealing (RTA) process is performed as first heat treatment with, for example, RTA apparatus at about 350° C. for 30 seconds, for example, in an inert atmosphere, and then the unreacted part of the Hf/Ni/Hf multilayer film 110 is selectively removed. Accordingly, a desired alloyed Ni silicide layer (Ni—Hf alloy silicide layer) 111 is formed only on the heavily-doped layer 109 and the gate electrodes 103. In this case, the removal of the unreacted part of the Hf/Ni/Hf multilayer film 110 is selectively performed with an acid chemical solution which is a mixture of, for example, either sulfuric acid or hydrochloric acid and a hydrogen peroxide solution. The temperature and time of the first heat treatment (RTA process) are optimized so as to obtain a desired alloyed silicide thickness of about 10 nm in the range from 300° C. to 500° C. and the range from 10 seconds to 90 seconds, respectively.

After the deposition of the Hf/Ni/Hf multilayer film 110 and before the process step shown in FIG. 2C, to prevent surface oxidation during the RTA process, a TiN film, for example, which is to serve as an anti-oxidation film may be deposited on the top Hf film of the Hf/Ni/Hf multilayer film 110 by reactive sputtering so as to form a TiN/Hf/Ni/Hf multilayer film.

Lastly, after the selective removal of the unreacted Hf/Ni/Hf multilayer film 110, to obtain a NiSi phase (nickel monosilicide phase) having a desired composition and serving as a low-resistance phase as the alloyed Ni silicide layer 111, an RTA process is performed as second heat treatment at 500° C. for 30 seconds, for example, in an inert atmosphere. In this case, the temperature and time of the second heat treatment (RTA process) are optimized so as to obtain a desired alloyed NiSi thickness of about 15 nm in the range from 400° C. to 600° C. and the range from 10 seconds to 90 seconds, respectively. In this embodiment, the alloyed Ni silicide layer 111 is a phase having a large Ni content, e.g., a $Ni_2Si$ phase, at the stage of the first heat treatment (RTA process). When this phase changes into a NiSi phase by the second heat treatment, the thickness of the alloyed Ni silicide layer 111 increases from about 10 nm to about 15 nm.

In this manner, in this embodiment, phase separation is reduced by the structure in which the Ni film is vertically sandwiched between other metal films, thereby obtaining the alloyed Ni silicide layer 111 having a desired composition. Specifically, diffusion of a metal under the Ni film to and across an upper portion of the multilayer film through the Ni film occurs in proportion to the concentration gradient of a metal (additional metal) other than Ni in the Ni film. Accordingly, if another metal film is provided on the Ni film, this diffusion is suppressed. This allows silicidation to be performed with the additional metal left in the Ni film, thereby obtaining alloyed Ni silicide having a desired composition.

Figure 3:
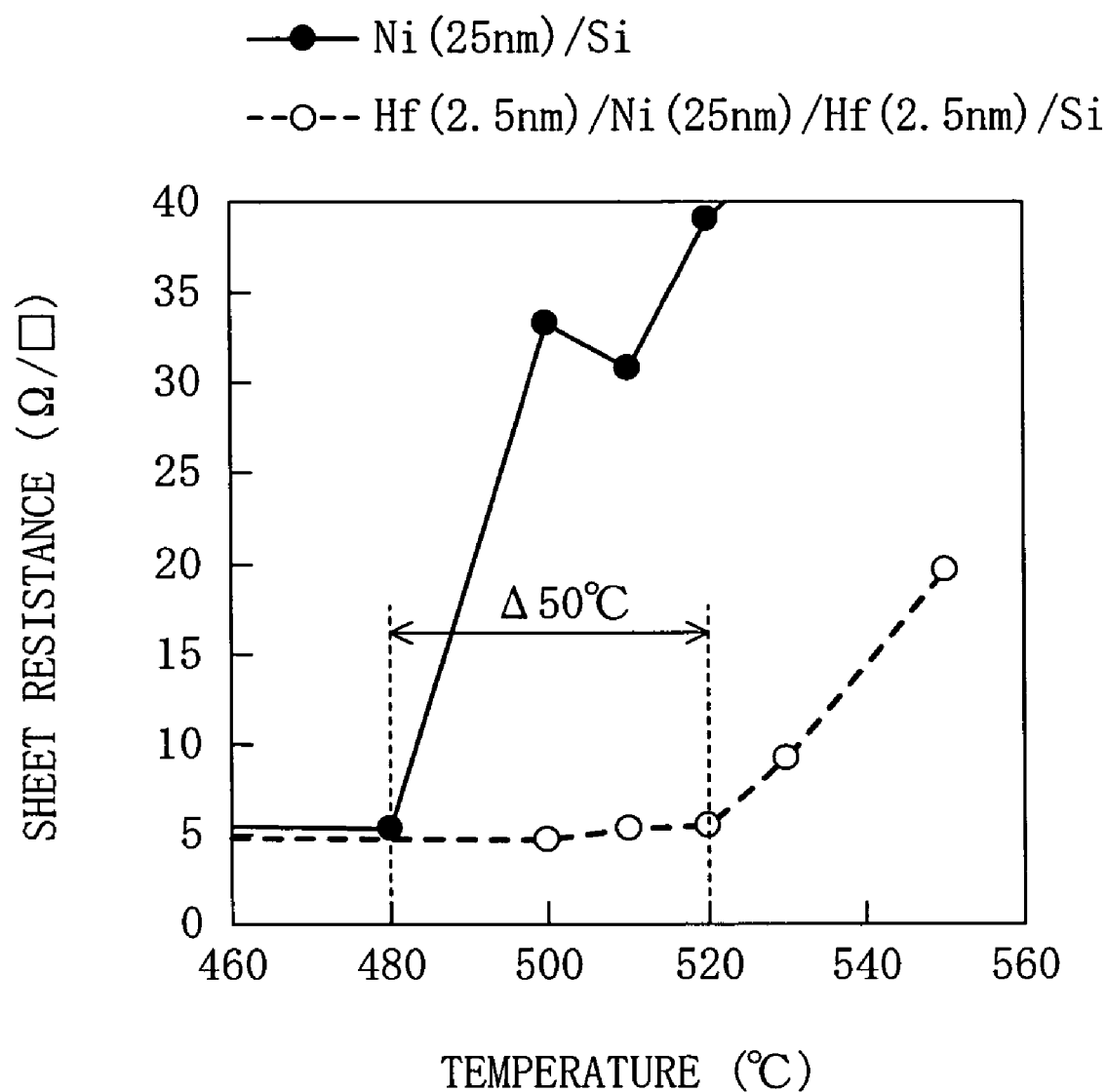
FIG. 3 is a graph showing improvement of heat resistance of Ni silicide in a semiconductor device according to the embodiment.

FIG. 3 is a graph showing improvement of heat resistance of Ni silicide by using a Hf/Ni/Hf multilayer film in this embodiment. In FIG. 3, the ordinate and the abscissa represent sheet resistance and heat treatment temperature, respectively, as indicators of the heat resistance of Ni silicide.

As shown in FIG. 3, in a case where Ni silicide is formed using a conventional Ni single-layer film (with a thickness of 25 nm) represented by solid circles, the sheet resistance starts increasing at 480° C. Therefore, it is determined that the upper limit of the heat resistance is 480° C. On the other hand, in a case where Ni silicide (alloyed Ni silicide) is formed using a Hf/Ni/Hf multilayer film of this embodiment represented by open circles, the sheet resistance starts increasing at 520° C., but the rise of the sheet resistance is gentle even at higher heat-treatment temperatures. That is, the upper limit of the heat resistance of alloyed Ni silicide of this embodiment is higher than conventional Ni silicide by as much as about 50° C.

Though not shown, in a case where Ni silicide (alloyed Ni silicide) is formed by using a bilayer film such as a Ni/Hf bilayer film or a Hf/Ni bilayer film, as a comparative example, the improvement of heat resistance is hardly observed or is only a little over 10° C. as compared to the case of using a conventional Ni single-layer film, and remarkable improvement of heat resistance as observed in this embodiment is not achieved. It is considered that this is because alloying was made incomplete by phase separation as shown in, for example, non-patent literature 6.

As described above, in this embodiment, the structure of the Hf/Ni/Hf multilayer film 110 and the temperature and time of heat treatment for silicidation are controlled, so that the alloyed Ni silicide layer (Ni alloy silicide layer) 111 having a desired composition is formed. Accordingly, this alloyed Ni silicide layer 111 is easily formed without using a sputtering target prepared for each alloyed silicide to be formed.

In addition, in this embodiment, even in the case of using a metal which easily causes phase separation as a metal other than Ni in Ni alloy silicide (i.e., in a case where it is difficult to form a Ni alloy silicide layer by a conventional technique (the second method)), the structure in which a Ni film is vertically sandwiched between other metal films ensures improvement of heat resistance of the alloyed Ni silicide layer 111, as described above. As a result, a semiconductor device capable of being miniaturized and operating at high speed is implemented with less production failures.

In this embodiment, the Hf/Ni/Hf multilayer film 110 is formed to form the alloyed Ni silicide layer 111. Alternatively, a multilayer metal film in which a Ni film is vertically sandwiched between metal films each made of a metal, such as Zr, Nb, Ta, Ti or V, which easily causes phase separation may be used. In such a case, the metal films (first and second metal films) vertically sandwiching the Ni film may be made of an identical metal. However, even if the first and second metal films are made of different metals, the same advantages as those in this embodiment are obtained as long as these metals easily cause phase separation. Each of the first and second metal films may contain an element other than the metals mentioned above as long as each of these films is mainly made of Hf, Zr, Nb, Ta, Ti or V.

What is claimed is:

1. A method for fabricating a semiconductor device, the method comprising the steps of:
    forming a gate electrode on a silicon substrate;
    forming source/drain regions at both sides of the gate electrode in the silicon substrate; and
    forming an alloyed silicide layer on the source/drain regions,
    wherein the step of forming the alloyed silicide layer includes the step of depositing a first metal film, a nickel film and a second metal film in this order to form a multilayer metal film and the step of performing heat treatment after the formation of the multilayer metal film, and
    the first metal film and the second metal film are made of a material other than Ni.

2. The method of claim 1, wherein the first and second metal films are made of an identical metal.

3. The method of claim 1, wherein each of the first and second metal films is made of a metal which easily causes phase separation during the formation of the alloyed silicide layer.

4. The method of claim 1, wherein each of the first and second metal films is mainly made of a metal selected from the group consisting of Hf, Zr, Nb, Ta, Ti and V.

5. The method of claim 1, wherein the step of forming the alloyed silicide layer includes the step of forming an anti-oxidation film on the multilayer metal film.

6. A semiconductor device, comprising:
    a gate electrode formed on a silicon substrate:
    source/drain regions formed at both sides of the gate electrode in the silicon substrate; and
    an alloyed silicide layer formed on the source/drain regions,
    wherein the alloyed silicide layer is made of alloyed Ni silicide formed by reaction between the silicon substrate and a multilayer metal film formed by depositing a first metal film, a nickel film and a second metal film in this order, and
    the first metal film and the second metal film are made of a material other than Ni.

7. The semiconductor device of claim 6, wherein the first and second metal films are made of an identical metal.

8. The semiconductor device of claim 6, wherein each of the first and second metal films is made of a metal which easily causes phase separation during the formation of the alloyed silicide layer.

9. The semiconductor device of claim 6, wherein each of the first and second metal films is mainly made of a metal selected from the group consisting of Hf, Zr, Nb, Ta, Ti and V.

10. The semiconductor device of claim 1, wherein the nickel film has a larger thickness than the first metal film and the second metal film.

11. The semiconductor device of claim 6, wherein the nickel film has a larger thickness than the first metal film and the second metal film.

* * * * *